US010109265B2

(12) United States Patent
Moriyama

(10) Patent No.: US 10,109,265 B2
(45) Date of Patent: Oct. 23, 2018

(54) EFFECT PROVIDING APPARATUS, EFFECT PROVIDING METHOD, STORAGE MEDIUM AND ELECTRONIC MUSICAL INSTRUMENT

(71) Applicant: CASIO COMPUTER CO., LTD., Shibuya-ku, Tokyo (JP)

(72) Inventor: Osamu Moriyama, Ome (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 0 days.

(21) Appl. No.: 15/716,078

(22) Filed: Sep. 26, 2017

(65) Prior Publication Data

US 2018/0090113 A1 Mar. 29, 2018

(30) Foreign Application Priority Data

Sep. 27, 2016 (JP) ................................ 2016-187776

(51) Int. Cl.

| | |
|---|---|
| ***H03G 3/00*** | (2006.01) |
| ***G10H 1/00*** | (2006.01) |
| ***G10H 1/02*** | (2006.01) |
| ***G10H 1/18*** | (2006.01) |
| ***G10H 1/46*** | (2006.01) |
| ***H04H 60/04*** | (2008.01) |

(52) U.S. Cl.

CPC ......... *G10H 1/0091* (2013.01); *G10H 1/0008* (2013.01); *G10H 1/02* (2013.01); *G10H 1/18* (2013.01); *G10H 1/46* (2013.01); *H04H 60/04* (2013.01)

(58) Field of Classification Search

CPC ...... H04R 3/04; G10H 1/0008; G10H 1/0016; G10H 1/0091; G10H 1/40; G10H 1/42; G10H 3/02; G10H 3/18; G10H 3/187; G10H 3/46; G10H 2210/375; G10H 2210/381; G10H 2210/385; G10H 2210/391; G10H 2220/086

USPC ........ 381/61, 62, 63, 118; 84/609, 630, 635, 84/636, 651, 652, 667, 668

See application file for complete search history.

(56) References Cited

U.S. PATENT DOCUMENTS 4,998,281 A * 3/1991 Sakata ................ G10H 1/0091 381/63
5,463,691 A * 10/1995 Nakae ................. G10H 1/0008 381/61

(Continued)

FOREIGN PATENT DOCUMENTS

| | | |
|---|---|---|
| JP | 2006058595 A | 3/2006 |
| JP | 2014132704 A | 7/2014 |
| JP | 2016065897 A | 4/2016 |

*Primary Examiner* — Xu Mei
(74) *Attorney, Agent, or Firm* — Holtz, Holtz & Volek PC

(57) ABSTRACT

An effect providing apparatus is provided which ostensibly increases the number of effects that can be simultaneously provided. When switching to flanger processing is performed while filter processing in accordance with a periodic signal (LFO signal) is being performed in an effect processing section that can provide only one effect, a CPU advances the periodic signal (LFO signal) from a phase at the time of the switching, and performs the filter processing in accordance with the advancing periodic signal when the flanger processing is ended. As a result of this configuration, the number of effects that can be simultaneously provided is ostensibly increased.

12 Claims, 7 Drawing Sheets

(56) References Cited

U.S. PATENT DOCUMENTS

| | | | | | |
|---|---|---|---|---|---|
| 5,652,797 | A * | 7/1997 | Okamura | G10H 1/0091 | 381/118 |
| 5,703,312 | A * | 12/1997 | Takahashi | G10H 1/0091 | 381/61 |
| 5,773,743 | A * | 6/1998 | Ogawa | G10H 1/363 | 434/307 A |
| 7,875,789 | B2 * | 1/2011 | Mizuhiki | G10H 1/0075 | 84/600 |
| 8,704,068 | B2 * | 4/2014 | Bowen | G10H 1/40 | 700/94 |
| 9,479,864 | B2 * | 10/2016 | Shirai | H04H 60/04 | |
| 2006/0274905 | A1 * | 12/2006 | Lindahl | H04R 5/04 | 381/61 |
| 2009/0022331 | A1 * | 1/2009 | DeBoer | G06N 3/04 | 381/61 |
| 2010/0011941 | A1 * | 1/2010 | Becker | G10H 1/00 | 84/612 |

* cited by examiner

EFFECT PROVIDING APPARATUS, EFFECT PROVIDING METHOD, STORAGE MEDIUM AND ELECTRONIC MUSICAL INSTRUMENT

CROSS-REFERENCE TO RELATED APPLICATION

This application is based upon and claims the benefit of priority from the prior Japanese Patent Application No. 2016-187776, filed Sep. 27, 2016, the entire contents of which are incorporated herein by reference.

BACKGROUND OF THE INVENTION

1. Field of the Invention

The present invention relates to an effect providing apparatus, an effect providing method, a storage medium, and an electronic musical instrument capable of ostensibly increasing the number of effects that can be simultaneously provided.

2. Description of the Related Art

Conventionally, apparatuses have been known which provide an input signal with various effects such as a reverb effect and a delay effect. For example, Japanese Patent Application Laid-Open (Kokai) Publication No. 2006-058595 discloses this type of apparatus. In this technique, the waveform shape of an LFO (Low Frequency Oscillator) waveform sectioned into an A section and a B section is determined for each section, and then the ratio of the A section of the waveform to the entire one period of the waveform is defined by a parameter Duty. In addition, an LFO waveform is generated in which the random variation range of an LFO wave crest value in the A section and the random variation range of an LFO wave crest value in the B section have been limited. Then, in accordance with the generated LFO waveform, the pitch, timbre, and sound volume of a generated musical sound are modulated so as to provide effects.

In general, an effect providing apparatus provided in a low-cost electronic musical instrument has a problem in that plural types of effects are difficult to be simultaneously processed. This is because the processing power of a DSP (Digital Signal Processor) and/or a CPU (Central Processing Unit) therein is not high.

The present invention is to provide an effect providing apparatus, an automatic musical performance method, a storage medium, and an electronic musical instrument by which even an electronic musical instrument or apparatus having a low-performance processor can give a user an impression that a plurality of effect processings, which are not actually being simultaneously performed by the processor, are being simultaneously performed.

SUMMARY OF THE INVENTION

In accordance with one aspect of the present invention, there is provided an effect providing apparatus comprising: a processor, wherein the processor performs first effect processing for providing inputted musical sound data with a first effect based on a parameter value that varies with time; second effect processing for providing, when provision of a second effect different from the first effect is specified while the first effect is being provided by the first effect processing, the inputted musical sound data with the second effect in place of the first effect; parameter update continuation processing for continuing variation in the parameter value while the second effect is being provided by the second effect processing; and control processing for controlling such that, when the specification of the provision of the second effect is released, the first effect processing provides the inputted musical sound data with the first effect based on the parameter value continued to be varied by the parameter update continuation processing, and wherein the first effect processing does not provide the inputted musical sound data with the first effect while the second effect processing is providing the inputted musical sound data with the second effect.

The above and further objects and novel features of the present invention will more fully appear from the following detailed description when the same is read in conjunction with the accompanying drawings. It is to be expressly understood, however, that the drawings are for the purpose of illustration only and are not intended as a definition of the limits of the invention.

BRIEF DESCRIPTION OF THE DRAWINGS

The present invention can be more clearly understood by the detailed description below being considered together with the following drawings.

DETAILED DESCRIPTION OF THE PREFERRED EMBODIMENTS

An embodiment of the present invention will hereinafter be described with reference to the drawings.

A. Overview

Figure 1A:
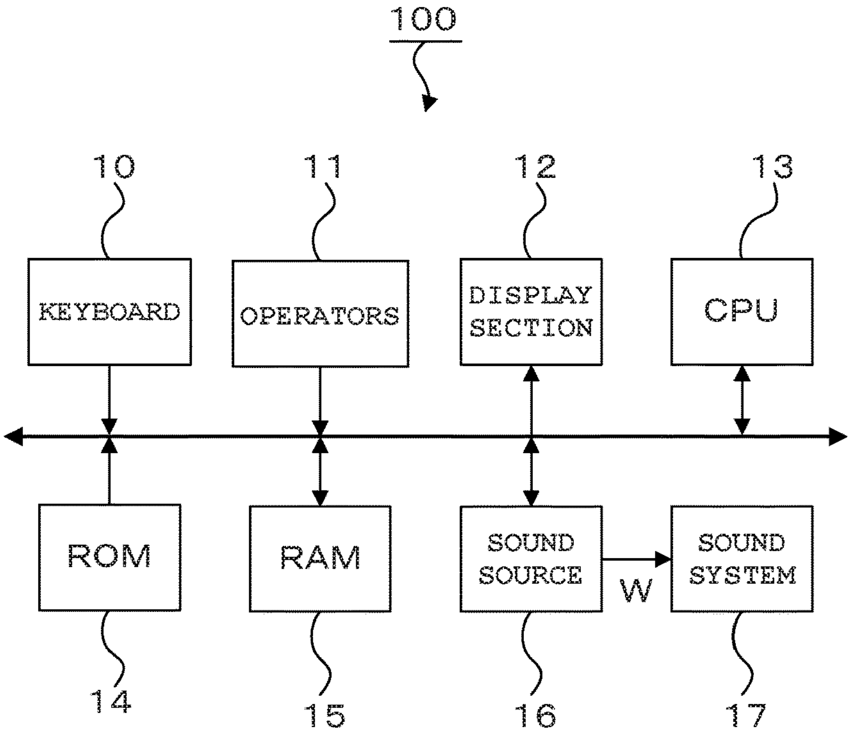
FIG. 1A is a block diagram showing an overview of an electronic musical instrument 100 according to an embodiment of the present invention.

FIG. 1A is a block diagram showing an overview of an electronic musical instrument 100 according to an embodiment of the present invention. A keyboard 10 in FIG. 1A generates musical performance input information including a key-ON/key-OFF signal, a key number, velocity, and the like based on a musical performance input operation (key pressing/releasing operation). The musical performance input information generated by the keyboard 10 is converted by a CPU 13 into a note-ON/note-OFF event in MIDI (Musical Instrument Digital Interface) format and then supplied to a sound source 16.

Figure 1B:
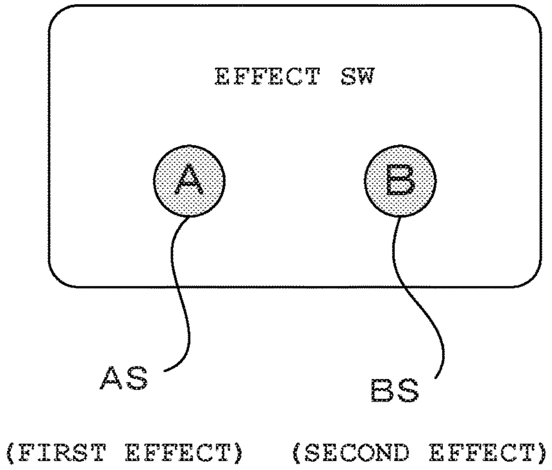
FIG. 1B is a diagram showing an A effect switch AS and a B effect switch BS included in a plurality of operators 11.

Operators 11 in FIG. 1A include, in addition to a power supply switch for turning the power source of the apparatus ON/OFF, a music selection switch for selecting a musical piece for an automatic musical performance, a start/stop switch for providing an instruction to start or stop an automatic musical performance, and an A effect switch AS and a B effect switch BS shown in FIG. 1B. These operators 11 generate switch events of types corresponding to switch operations, and these various switch events generated by the operators 11 are loaded into the CPU 13.

By the A effect switch AS in FIG. 1B being pressed, the CPU 13 instructs the sound source 16 to perform effect processing called filter processing (first effect processing). In the filter processing, on a generated musical sound, low-pass filtering (first effect processing) is performed which varies a cutoff frequency (parameter value) with time for a certain period from when the A effect switch AS is pressed, in accordance with, for example, the phase of a periodic signal (LFO signal). As the period in which the filter processing is performed, in the case of tempo synchronization, the number of beats corresponding to an execution period is set in advance in a ROM 14 and a RAM 15. Also, during a period from when the B effect switch BS is pressed until when it is released, the CPU 13 instructs the sound source 16 to perform effect processing called flanger processing (second effect processing), which will be described in detail later.

A display section 12 in FIG. 1A is constituted by a liquid-crystal display panel, a display driver, and the like, and displays on its screen the setting status, operation status, and the like of each section of the musical instrument in accordance with a display control signal supplied from the CPU 13. The CPU 13 sets the operation status of each section of the apparatus based on various switch events supplied from the operators 11, instructs the sound source 16 to generate musical sound data W based on musical performance input information supplied from the keyboard 10, or instructs the sound source 16 to start or stop automatic musical performance in accordance with a depression operation on the start/stop switch. Also, the CPU 13 performs effect processing (at least one of the first effect processing and the second effect processing) described later which, even when simultaneous processing of a plurality of effects (the first effect processing and the second effect processing) is difficult for the sound source 16 due to restrictions on the system resources, gives the user an impression that the sound source 16 is simultaneously processing the plurality of effects (the first effect processing and the second effect processing).

Figure 2A:
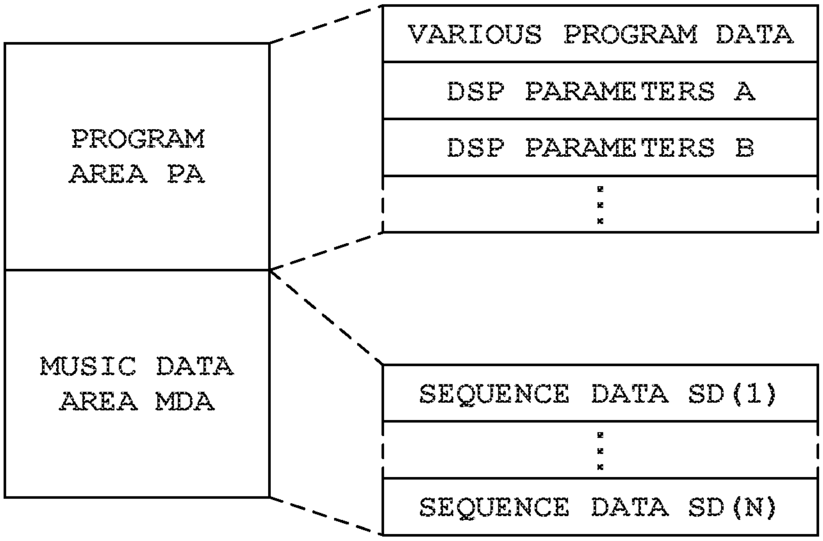
FIG. 2A is a memory map of the data structures of programs and music data stored in a ROM (Read Only Memory) 14.

The ROM 14 includes a program area PA and a music data area MDA, as shown in FIG. 2A. In the program area PA of the ROM 14, various control programs to be loaded into the CPU 13, DSP parameters A and B to be transferred to an effect processing section 161 described later (refer to FIG. 3), and the like are stored. These various control programs include a program for effect processing described below. The purpose of the DSP parameters A and B will be described later.

In the music data area MDA of the ROM 14, the sequence data SD(1) to SD(N) of a plurality of musical pieces are stored, and one of these sequence data SD(1) to SD(N) is selected as music data for an automatic musical performance in accordance with an operation on the above-described music selection switch.

Figure 2B:
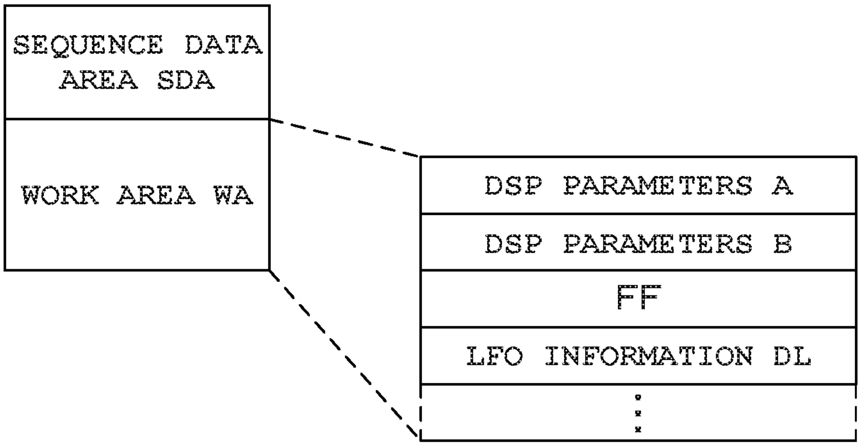
FIG. 2B is a memory map of the data structures of variables stored in a RAM (Random Access Memory) 15.

The RAM 15 includes a sequence data area SDA and a work area WA, as shown in FIG. 2B. In the sequence data area SDA of the RAM 15, sequence data SD(n) whose number n has been selected by an operation on the music selection switch and which has been read out from the music data area MDA of the ROM 14 are stored.

The sequence data SD(n) herein includes a plurality of musical performance tracks (music data), and each of them includes a header having stored therein a format indicating a data format, a time base representing a resolution, and the like; a system track having stored therein a music title, tempo (BPM), beats, and the like; and musical performance data indicating a pitch and the sound emission timing of each note in each musical instrument part.

In the work area WA of the RAM 15, DSP parameters A and B transferred from the ROM 14 under the control of the CPU 13 are temporarily stored. Note that these DSP parameters A and B are read out from the program area PA of the ROM 14 at the time of system initialization, and then stored in the work area WA of the RAM 15.

Figure 3A:
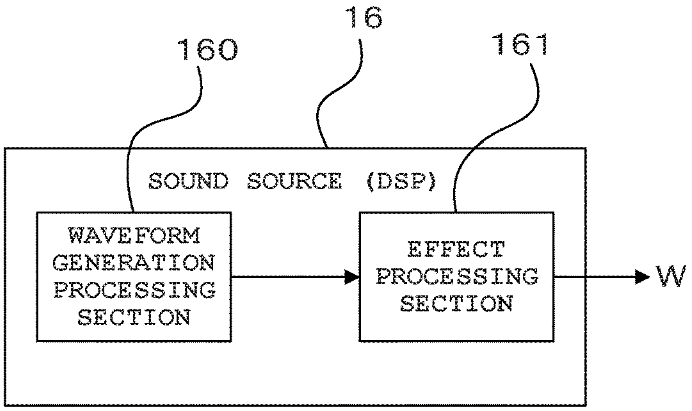
FIG. 3A is a block diagram of a sound source 16.

Also, in this work area WA, for example, a filter flag FF and LFO information DL are temporarily stored as various register/flag data for use in processing by the CPU 13. The filter flag FF indicates "1" when the filter processing is being performed, and indicates "0" when the filter processing is completed. The LFO information DL includes the current phase, angular velocity, and execution period of an LFO in the filter processing Next, referring back to FIG. 1, the overview of the electronic musical instrument 100 is further described. The sound source 16 in FIG. 1 includes a known DSP for waveform arithmetic. This sound source 16 includes, when each function of a microprogram to be performed in the DSP is regarded as a hardware image, a waveform generation processing section 160 and an effect processing section 161 as shown in FIG. 3A. Specific processing to be performed by the sound source 16 will be described later. A sound system 17 in FIG. 1 converts musical sound data W outputted from the sound source 16 into musical sound signals in an analog format, performs filtering such as removing unnecessary noise from the musical sound signals, amplifies the resultant signals, and emits sounds from a loudspeaker (not shown).

B. Sound Source 16

Next, the sound source 16 (which includes the waveform generation processing section 160 and the effect processing section 161 in the present embodiment) is described with reference to FIG. 3A.

The waveform generation processing section 160 includes a plurality of sound emission channels achieved by a known waveform memory read method. This waveform generation procession section 160 emits musical sound data W supplied from the CPU 13 in accordance with a note-ON/note-OFF event based on musical performance input information. In a case where an automatic musical performance is being performed, this waveform generation procession section 160 emits musical sound data W for each musical performance track (musical instrument part) based on sequence data SD read out by the CPU 13 from the sequence data area SDA of the RAM 15.

The effect processing section 161 provides an effect to musical sound data W outputted from the waveform generation processing section 160. This effect processing section 161 of the present embodiment cannot provide plural types of effects simultaneously and can only provide a single effect.

Note that the present invention can be applied in an apparatus not incapable of simultaneously performing a plurality of effect processings, that is, an apparatus capable of simultaneously performing a plurality of effect processings. That is, the present invention can be achieved by any apparatus as long as it has a configuration by which, when there is second effect processing not being performed while first effect processing is being performed by a processor, the user receives an impression that the first effect processing and the second effect processing are being simultaneously performed. Also, the first effect processing may include not only one processing but two or more processings. Similarly, the second effect processing may include not only one processing but two or more processings The effect processing section 161 performs predetermined processing in accordance with DSP parameters supplied from the CPU 13.

Figure 3B:
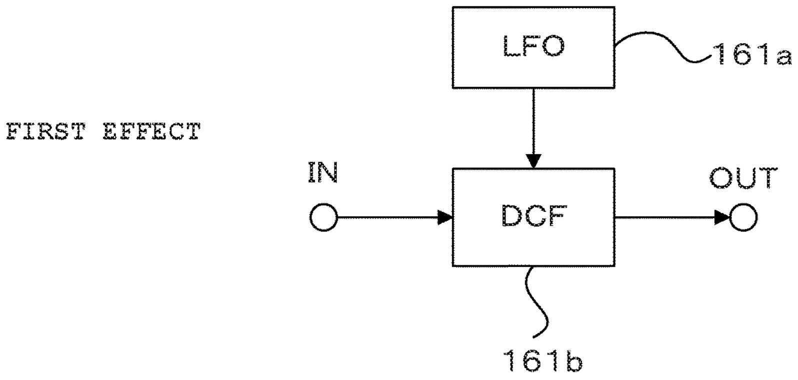
FIG. 3B is a block diagram of an effect processing section 161 actualized by a DCF (Digital Controlled Filter) provided by the A effect switch AS being pressed (first effect processing)

Specifically, when the CPU 13 supplies DSP parameters A read out from the work area WA of the RAM 15 to the sound source 16 (DSP), the effect processing section 161 performs processing shown in FIG. 3B (first effect processing). In FIG. 3B, an LFO 161*a* generates an LFO signal in accordance with a rate and periodicity included in the DSP parameters A during a filter processing execution period.

A DCF 161*b* in FIG. 3B is, for example, an FIR (Finite Impulse Response) filter and has a low-pass characteristic of changing a cutoff frequency fc with time in accordance with an LFO signal outputted from the LFO 161*a*. Accordingly, in the effect processing section 161, low-pass filtering where a cutoff frequency fc is changed with time in accordance with an LFO signal is performed on musical sound data W inputted from an input terminal IN, whereby an effect (filter processing) is provided which gives a timbre change to the musical sound data W.

Figure 3C:
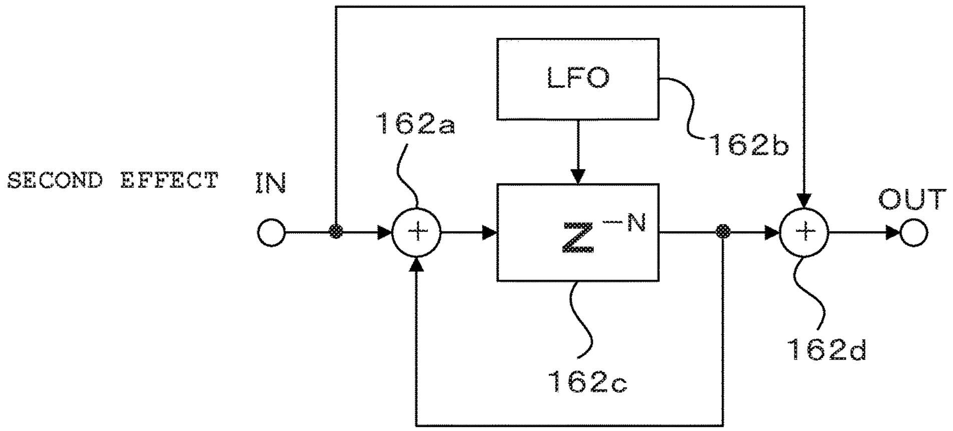
FIG. 3C is a block diagram showing processing of the effect processing section 161 while the B effect switch BS is being pressed (second effect processing)

Also, when the CPU 13 supplies DSP parameters B read out from the work area WA of the RAM 15 to the sound source 16 (DSP), the effect processing section 161 performs processing shown in FIG. 3C (second effect processing). In FIG. 3C, an adder 162*a* adds an N-sample delay signal outputted from an N-sample delay circuit 162*c* to musical sound data W inputted from an input end IN for feedback input to the N-sample delay circuit 162*c*.

An LFO 162*b* in FIG. 3C generates an LFO signal in accordance with a rate and periodicity included in the DSP parameters B. The N-sample delay circuit 162*c* outputs an N-sample delay signal acquired by performing, on the output from the adder 162*a*, an N-sample delay in accordance with the LFO signal. An adder 162*d* in FIG. 3C adds the N-sample delay signal outputted from the N-sample delay circuit 162*c* to the musical sound data W inputted from the input end IN, and supplies it to an output end OUT. By this processing where the musical sound data W subjected to the N-sample delay by the LFO modulation is added to the original sound (the inputted musical sound data W), an effect called flanger is provided.

In the present embodiment, in the effect processing section 161, when one of the "filter processing (first effect processing)" based on DSP parameters A supplied from the CPU 13 and the "flanger processing (second effect processing)" based on DSP parameters B supplied from the CPU 13 is performed on inputted musical sound data W, the user receives an impression that both effect processings, that is, both the filter processing (first effect processing) and the flanger processing (second effect processing) are being simultaneously performed.

C. Operations

Figure 4:
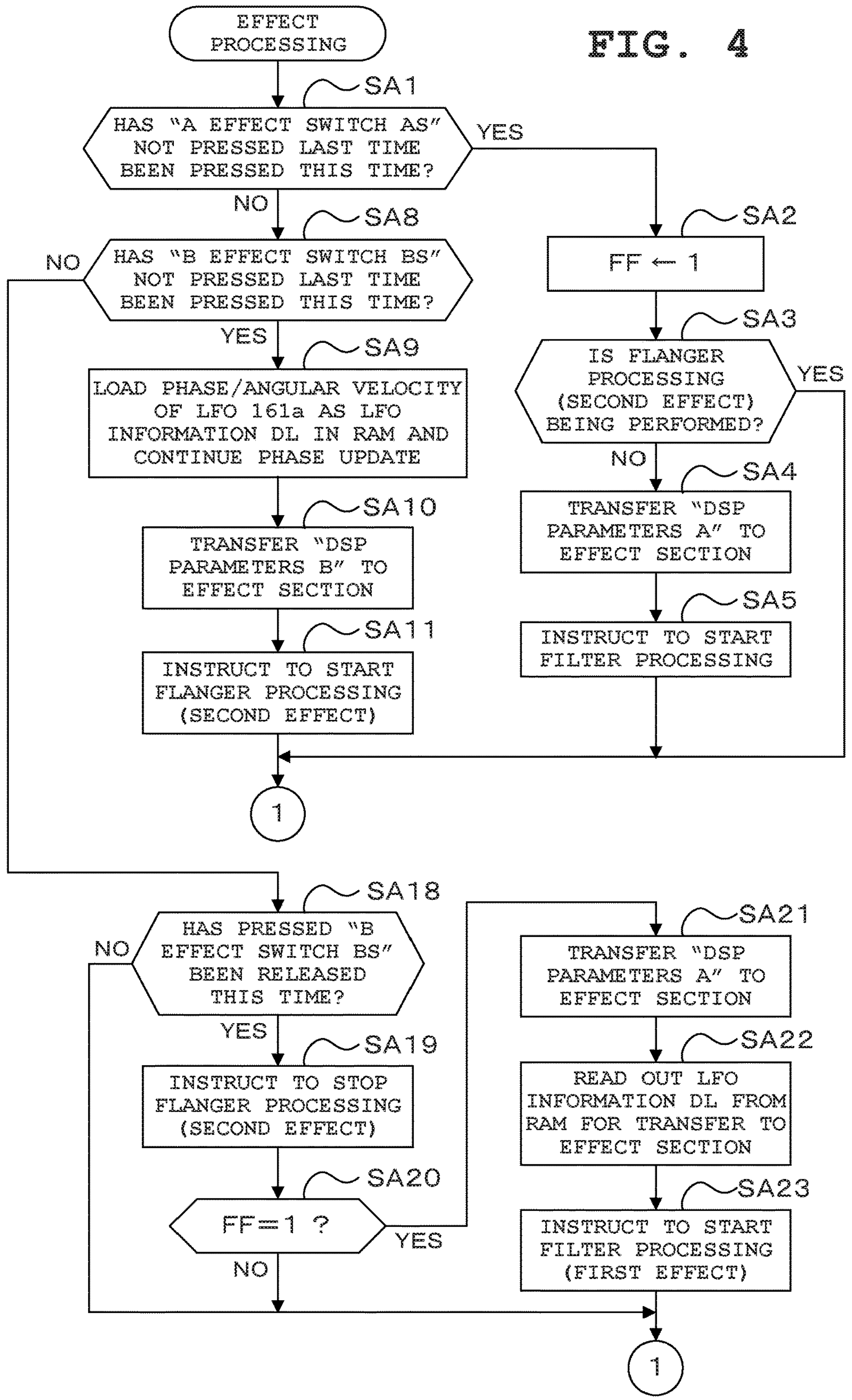
FIG. 4 is a flowchart of operations to be performed by a CPU 13 in effect processing.
Figure 5:
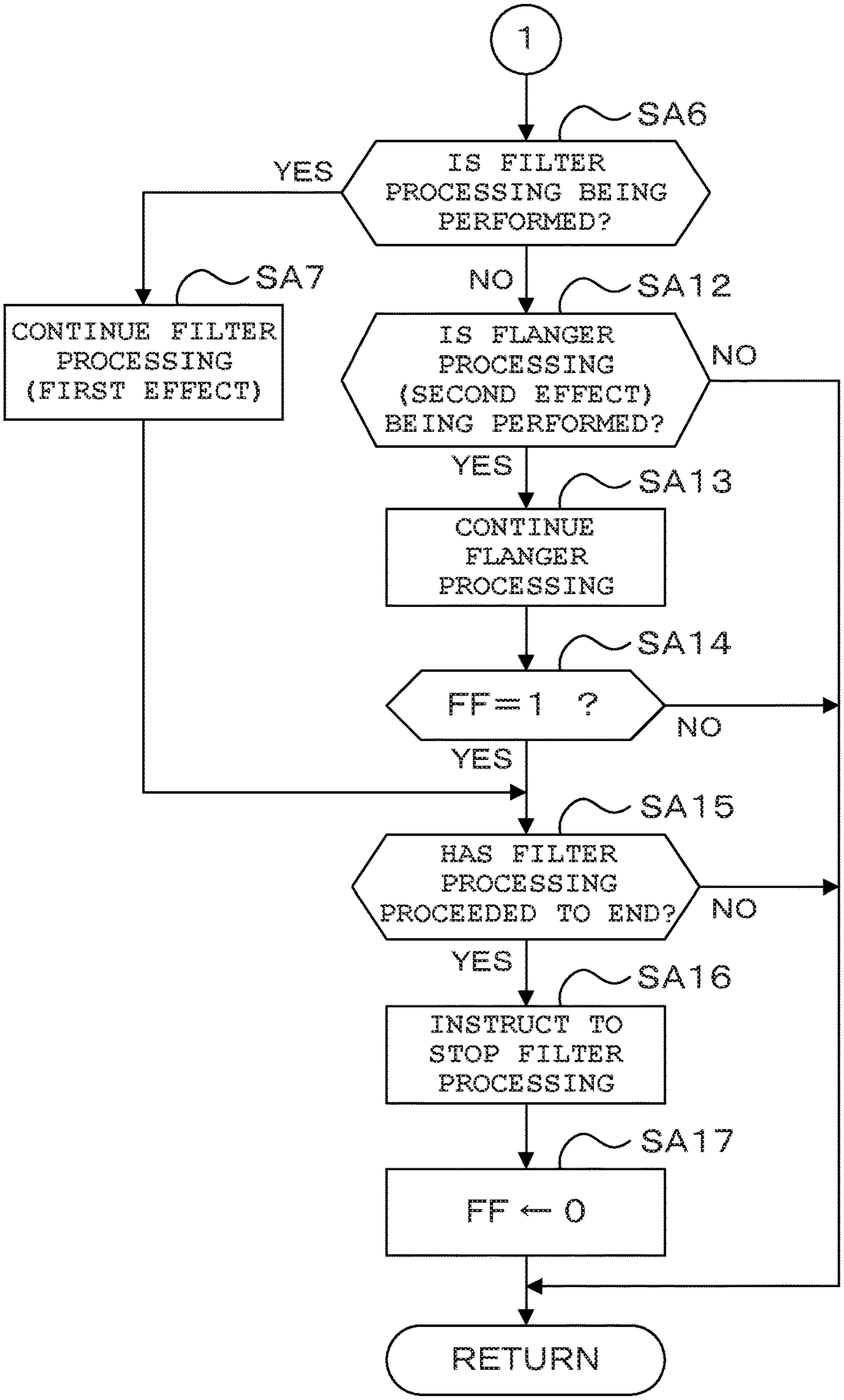
FIG. 5 is also a flowchart of operations to be performed by the CPU 13 in the effect processing.
Figure 6:
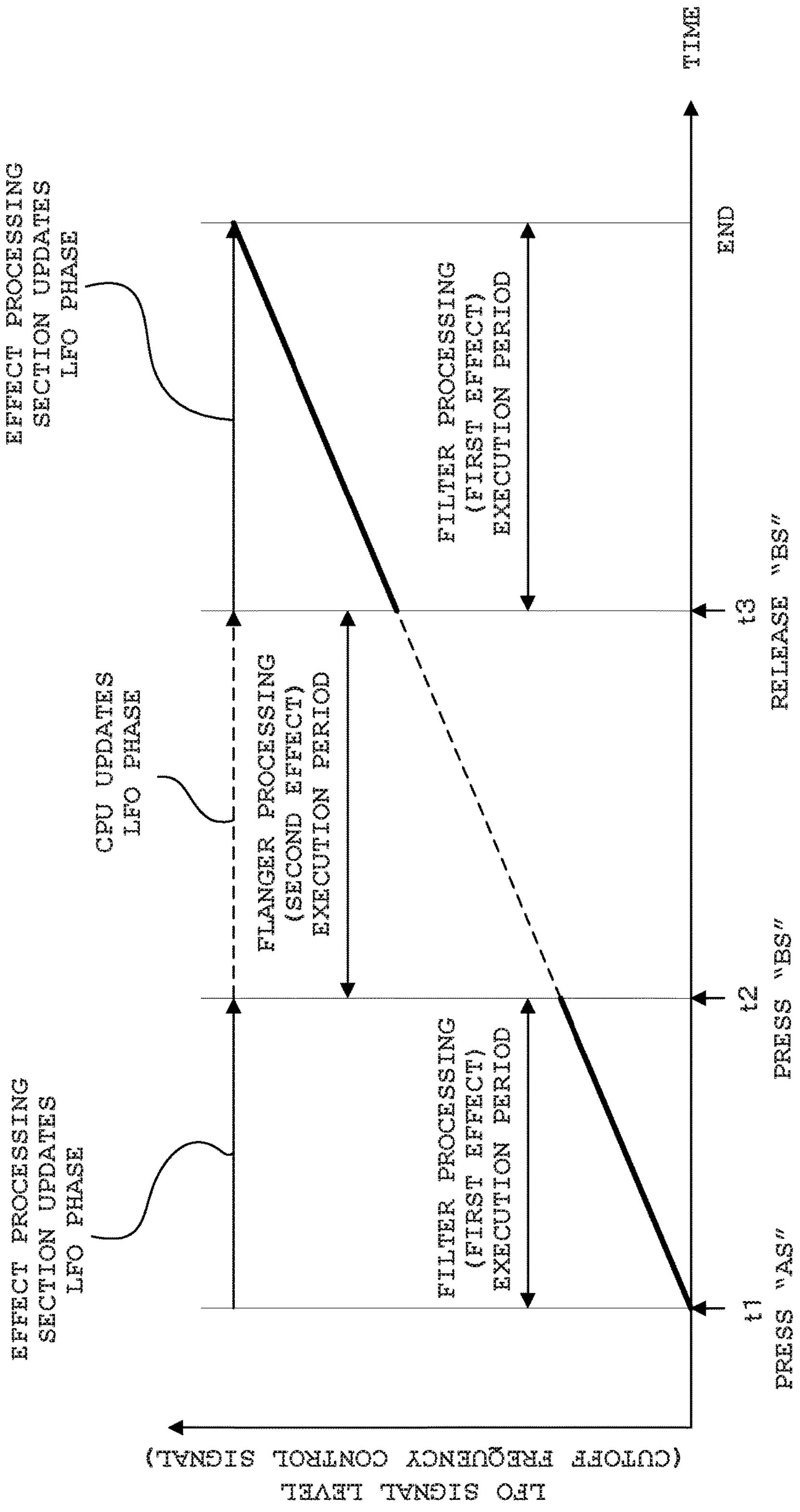
FIG. 6 is a graph for describing an operation example of the effect processing.
Figure 7:
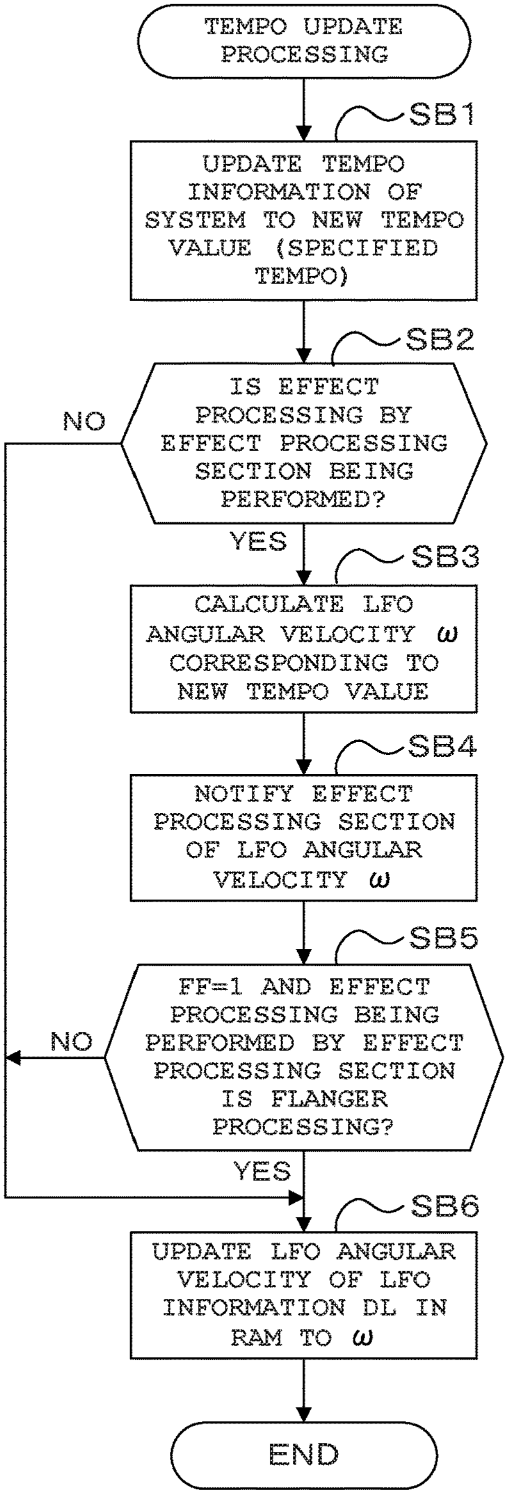
FIG. 7 is a flowchart of operations to be performed by the CPU 13 in tempo update processing.

Next, as operations of the above-described electronic musical instrument 100, operations to be performed by the CPU 13 in effect processing are described with reference to FIG. 4 to FIG. 7. FIG. 4 and FIG. 5 are flowcharts of operations to be performed by the CPU 13 in effect processing, and FIG. 6 is a graph for describing an operation example of the effect processing. FIG. 7 is a flowchart of operations to be performed by the CPU 13 in tempo update processing. Note that the below-described effect processing is performed in a configuration where the automatic musical performance of the sequence data SD of a musical piece selected by the user is performed and the effect processing section 161 provides an effect to musical sound data W outputted from the waveform generation processing section 160 of the sound source 16 by the automatic musical performance.

(1) Operations in Effect Processing

When the electronic musical instrument 100 is turned ON, the CPU 13 performs, in the main routine not shown, switch scanning for detecting an event of any of various operation switches arranged on the operators 11, and then performs effect processing in accordance with this switch scanning. When the effect processing is performed, the CPU 13 proceeds to Step SA1 shown in FIG. 4 and judges whether the A effect switch AS not pressed last time has been pressed this time.

For example, at time t1 shown in FIG. 6, when the user presses the A effect switch AS not pressed last time, the judgment result at Step SA1 is "YES" and therefore the CPU 13 proceeds to Step SA2. At Step SA2, the CPU 13 sets the filter flag FF at "1", and starts the filter processing (first effect processing). Then, the CPU 13 proceeds to the next Step SA3 and judges whether the flanger processing (second effect processing) is being performed. In the example shown in FIG. 6, the flanger processing is not being performed. Therefore, the judgment result is "NO", and the CPU 13 proceeds to Step SA4.

At Step SA4, the CPU 13 transfers DSP parameters A stored in the work area WA (refer to FIG. 2) of the RAM 15 to the effect processing section 161 (refer to FIG. 3A) of the sound source 16. As a result, the effect processing section 161 performs processing shown in FIG. 3B based on the DSP parameters A, that is, performs processing by the LFO 161*a* which generates an LFO signal in accordance with a rate and periodicity included in the DSP parameters A and by the DCF 161*b* having a low-pass characteristic where a cutoff frequency fc is varied with time in accordance with the LFO signal.

Subsequently, the CPU 13 proceeds to Step SA5, instructs the effect processing section 161 to start the filter processing, and proceeds to Step SA6 shown in FIG. 5. Note that, in the effect processing section 161 which has started the filter processing (first effect processing) by following the instruction from the CPU 13, the DCF 161*b* controls the cutoff frequency fc in accordance with the LFO signal generated by the LFO 161*a*.

Next, the CPU 13 proceeds to Step SA6 (refer to FIG. 5), and judges whether the filter processing (first effect processing) is being performed. When the effect processing section 161 is performing the filter processing, the judgment result is "YES" and therefore the CPU 13 proceeds to Step SA7. At Step SA7, the CPU 13 instructs the effect processing section 161 to continue the filter processing. Then, the CPU 13 proceeds to Step SA15 and judges whether the filter processing has proceeded to the end of an execution period set in advance. When the filter processing has not proceeded to the end, the judgment result is "NO" and therefore the CPU 13 once ends the processing.

Then, the CPU 13 starts the effect processing again and proceeds to Step SA1 described above (refer to FIG. 4).

Here, since the A effect switch AS has not been pressed this time, the judgment result is "NO". Accordingly, the CPU 13 proceeds to Step SA8, and judges whether the B effect switch BS not pressed last time has been pressed this time. For example, at time t2 shown in FIG. 6, the user presses the B effect switch BS not pressed last time.

Then, the judgment result of Step SA8 is "YES", and therefore the CPU 13 proceeds to Step SA9. At Step SA9, the CPU 13 loads the phase and angular velocity of the LFO 161*a*, stores the phase and angular velocity in the work area WA (refer to FIG. 2B) of the RAM 15 as LFO information DL, and continues its phase update. That is, since the effect processing section 161, which can only provide a single effect, is switched to perform the "flanger processing" from the "filter processing", the CPU 13 continues the phase update of the LFO information DL in place of the effect processing section 161 so that the "filter processing" is ostensibly continued.

Next, the CPU 13 proceeds to Step SA10, and transfers DSP parameters B stored in the work area WA (refer to FIG. 2) of the RAM 15 to the effect processing section 161 of the sound source 16. As a result, the effect processing section 161 has the configuration shown in FIG. 3C based on a microprogram included in the DSP parameters B, that is, functions as an effector called "flanger". Subsequently, the CPU 13 proceeds to Step SA11, instructs the effect processing section 161 to start the flanger processing (second effect processing), and proceeds to Step SA6 shown in FIG. 5.

In the effect processing section 161 which has started the flanger processing by following the instruction from the CPU 13, after time t2 in FIG. 6, musical sound data W subjected to N sample delay by LFO modulation is added to the original sound (inputted musical sound data W), whereby a flanger effect is provided.

The CPU 13 then proceeds to Step SA6 (refer to FIG. 5), and judges whether the filter processing is being performed. Here, the flanger processing is being performed and therefore the judgment result is "NO". Accordingly, the CPU 13 proceeds to Step SA12, and judges whether the flanger processing is being performed. Here, the flanger processing is being performed and therefore the judgment result is "YES". Accordingly, the CPU 13 proceeds to Step SA13, and instructs the effect processing section 161 to continue the flanger processing.

Then, the CPU 13 proceeds to Step SA14, and judges whether the filter flag FF indicates "1". In the case of the operation example in FIG. 6, the judgment result is "YES" and therefore the CPU 13 proceeds to Step SA15. At Step SA15, the CPU 15 judges whether the filter processing has proceeded to end. In this case, the filter processing has not proceeded to end. Accordingly, the judgment result is "NO" and therefore the CPU 13 once ends the effect processing.

Then, the CPU 13 starts the effect processing again and proceeds to Step SA1 described above. This time, the A effect switch AS is not pressed. Accordingly, the judgment result is "NO" and therefore the CPU 13 proceeds to Step SA8. At Step SA8, the CPU 13 judges whether the B effect switch BS has been pressed this time. Here, since the B effect switch BS is already being pressed by the press operation performed at time t2 shown in FIG. 6, the judgment result is "NO". Accordingly, the CPU 13 proceeds to Step SA18 and judges whether the B effect switch BS has been released this time.

For example, when the user releases the B effect switch BS at time t3 shown in FIG. 6, the judgment result at Step SA18 is "YES". Accordingly, the CPU 13 proceeds to Step SA19 and instructs the effect processing section 161 to stop the flanger processing, whereby the flanger processing is stopped in the effect processing section 161.

Then, the CPU 13 proceeds to Step SA20 and judges whether the filter flag FF indicates "1", that is, the effect processing section 161 is continuing the filter processing. In this case, the effect processing section 161 is continuing the filter processing. Accordingly, the judgment result is "YES" and therefore the CPU 13 proceeds to Step SA21. At Step SA21, the CPU 13 transfers the DSP parameters A stored in the work area WA (refer to FIG. 2) of the RAM 15 to the effect processing section 161 (refer to FIG. 3A) of the sound source 16. As a result, the effect processing section 161 is configured such that not the flanger processing (second effect processing) in FIG. 3C but the filter processing (first effect processing) in FIG. 3B is performed.

Subsequently, the CPU 13 proceeds to Step SA22, reads out the LFO information DL continued to be updated at Step SA9 described above from the work area WA (refer to FIG. 2B) of the RAM 15, and transfers the LFO information DL to the effect processing section 161. As a result, by loading the LFO information DL which had been updated by the CPU 13 during the flanger execution period, the effect processing section 161 acquires a non-discontinuous LFO phase as if it had been continuing the filter processing while performing the flanger processing.

As another embodiment, a configuration may be adopted in which an elapsed time from timing specified for providing the second effect (Step SA8) is counted; how much a parameter value is supposed to have been changed is calculated by counting from the timing specified for providing the second effect (SA8) to timing when the specification of the provision of the second effect is released (SA18); and the calculated parameter value is acquired at Step SA22.

Then, the CPU 13 proceeds to Step SA23, instructs the effect processing section 161 to start the filter processing, and proceeds to Step SA6 shown in FIG. 5. In the effect processing section 161 which has started the filter processing by following the instruction of the CPU 13, time t3 shown in FIG. 6 is taken as a restart point of the filter processing; the LFO 161*a* generates an LFO signal based on the LFO information DL acquired from the CPU 13 side; and the DCF 161*b* controls the cutoff frequency fc accordingly.

Then, the CPU 13 proceeds to Step SA6 and judges whether the filter processing is being performed. As described above, when the effect processing section 161 restarts the filter processing, the judgment result is "YES". Accordingly, the CPU 13 proceeds to Step SA7 and causes the filter processing of the effect processing section 161 to continue. Then, the CPU 13 proceeds to Step SA15 and judges whether the filter processing has proceeded to end. When the filter processing has proceeded to end, the judgment result is "YES" and therefore the CPU 13 proceeds to Step SA16. At Step SA16, the CPU 13 instructs the effect processing section 161 to stop the filter processing. Then, the CPU 13 proceeds to Step SA17, resets the filter flag FF to zero, and ends the effect processing.

(2) Operations in Tempo Update Processing

Next, operations to be performed by the CPU 13 in tempo update processing are described with reference to FIG. 7. In the following descriptions, a case is described in which the LFO angular velocity of an effect is synchronized with tempo information, that is, a tempo value when sequence data SD(N) is replayed. In this case, when the tempo value is changed by a user operation or the like, the LFO angular velocity follows in real time. As a result, even if the tempo value is changed when the B effect switch BS is being pressed during the filter processing, that is, when the CPU 13 is updating LFO information in the filter processing, the LFO angular velocity in the work area WA is changed in response thereto. A flowchart of these operations is shown in FIG. 7.

This processing is performed when a playback tempo is changed by a user operation or the like. First, the CPU 13 proceeds to Step SB1 and sets a new tempo value TEMPO (specified tempo) acquired by the change in the system. Next at Step SB2, the CPU 13 judges whether effect processing is being performed by the effect processing section 161. When effect processing is not being performed, the judgment result is "NO" and therefore the CPU 13 ends the tempo update processing. When effect processing is being performed, the judgment result is "YES" and therefore the CPU 13 proceeds to Step SB3.

At Step SB3, the CPU 13 calculates an LFO angular velocity ω based on the new tempo value TEMPO. This LFO angular velocity is subjected to tempo synchronization. Note that this synchronization timing is set in advance. For example, in a case where the LFO angular velocity is synchronized with a beat "BEAT", the LFO angular velocity ω is calculated by the following equation (1). Note that the tempo value "TEMPO" herein corresponds to the number of beats per second.

$$\omega = \mathrm{TEMPO}/(60 \times \mathrm{BEAT})(rad/s) \ldots \quad (1)$$

Next, the CPU 13 proceeds to Step SB4 and notifies the effect processing section 161 of the LFO angular velocity ω calculated at Step SB3. Here, the CPU 13 updates the current LFO angular velocity ω of the effect regardless of whether the effect processing being performed is the filter processing or the flanger processing, and performs the effect processing in synchronization with the tempo value TEMPO.

Subsequently, the CPU 13 proceeds to Step SB5 and judges whether or not the filter flag FF indicates "1" and the effect processing being performed by the effect processing section 161 is the flanger processing. When both of the conditions have been satisfied, that is, when the LFO phase update of the filter processing is being performed by the CPU 13, the judgment result is "YES". Accordingly, the CPU 13 proceeds to Step SB6, updates an LFO angular velocity included in LFO information stored in the work area WA of the RAM 15 to the LFO angular velocity ω calculated at Step SB3 described above, and thereby synchronizes an LFO phase value to be updated by the CPU 13 with the tempo value TEMP by the beat BEAT. After this synchronization processing or when the above-described conditions are not satisfied, the CPU 13 ends the tempo update processing.

In this tempo update processing, an LFO angular velocity is updated by being subjected to tempo synchronization, and therefore an LFO phase that is added in accordance with the LFO angular velocity can be subjected to tempo synchronization. In particular, an LFO angular velocity in the work area WA is also updated, and therefore tempo synchronization can be performed even when the update of the LFO phase is being performed by the CPU 13. Thus, even when a tempo change is performed while the flanger processing is being performed and then the flanger processing is ended and the filter processing is restarted, a value including the previous tempo change can be set as an LFO initial phase at the time of restart.

As described above, in the present embodiment, when switching to the second effect (flanger processing) which is different from the first effect (filter processing) is performed while the first effect (filter processing) in accordance with a periodic signal (LFO signal) is being provided in the effect processing section 161 which can only provide one effect, the periodic signal is advanced from a phase at the time of the switching, and the first effect (filter processing) in accordance with the advancing periodic signal is provided when the provision of the second effect (flanger) is ended. That is, the number of effects that can be simultaneously provided is ostensibly increased.

In the above-described embodiment, a configuration has been described in which switching to the flanger processing is performed while the filter processing is being provided. However, the gist of the present invention is not limited thereto, and may be applied to a combination of other types of effects as long as the configuration can be actualized in which, when switching to a second effect is performed while a first effect in accordance with a periodic signal is being provided, the periodic signal is advanced from a phase at the time of the switching to the second effect, and the first effect in accordance with the advancing periodic signal is provided when the provision of the second effect is ended.

While the present invention has been described with reference to the preferred embodiments, it is intended that the invention be not limited by any of the details of the description therein but includes all the embodiments which fall within the scope of the appended claims.

What is claimed is:

1. An effect providing apparatus comprising:

a processor, wherein the processor performs first effect processing for providing inputted musical sound data with a first effect based on a parameter value that varies with time;

second effect processing for providing, when provision of a second effect different from the first effect is specified while the first effect is being provided by the first effect processing, the inputted musical sound data with the second effect in place of the first effect;

parameter update continuation processing for continuing variation in the parameter value while the second effect is being provided by the second effect processing; and control processing for controlling such that, when the specification of the provision of the second effect is released, the first effect processing provides the inputted musical sound data with the first effect based on the parameter value continued to be varied by the parameter update continuation processing, and wherein the first effect processing does not provide the inputted musical sound data with the first effect while the second effect processing is providing the inputted musical sound data with the second effect.

2. The effect providing apparatus according to claim 1, wherein the processor performs tempo update processing for updating a tempo of a musical sound being played back to a specified tempo, and wherein the parameter update continuation processing continues to vary the parameter value based on the specified tempo.

3. The effect providing apparatus according to claim 1, wherein the parameter value is a cutoff frequency value.

4. The effect providing apparatus according to claim 1, wherein the parameter update continuation processing continues to vary the parameter value based on a change velocity of the parameter value acquired at timing when the provision of the second effect is specified.

5. The effect providing apparatus according to claim 1, wherein the parameter value is a value in accordance with a phase of a low frequency oscillator.

6. The effect providing apparatus according to claim 1, wherein the parameter value is a value in accordance with an angular velocity of a low frequency oscillator.

7. An electronic musical instrument comprising:

the effect providing apparatus according to claim 1;

an operator; and a loudspeaker which emits a musical sound provided with at least one of the first effect and the second effect by the effect providing apparatus.

8. The electronic musical instrument according to claim 7, wherein the processor performs tempo update processing for updating a tempo of a musical sound being played back to a specified tempo, and wherein the parameter update continuation processing continues to update the parameter value based on the specified tempo.

9. An effect providing method for an effect providing apparatus, comprising:

providing inputted musical sound data with a first effect based on a parameter value that varies with time;

providing, when provision of a second effect different from the first effect is specified while the first effect is being provided, the inputted musical sound data with the second effect in place of the first effect processing;

continuing variation in the parameter value while the second effect is being provided; and controlling such that, when the specification of the provision of the second effect is released, the first effect is provided based on the parameter value continued to be varied, wherein the first effect is not provided on the inputted musical sound data while the second effect is being provided on the inputted musical sound data.

10. The effect providing method according to claim 9, comprising:

updating a tempo of a musical sound being played back to a specified tempo; and continuing to vary the parameter value based on the specified tempo.

11. A non-transitory computer-readable storage medium having stored thereon a program that is executable by a computer in an effect providing apparatus to perform functions comprising:

providing inputted musical sound data with a first effect based on a parameter value that varies with time;

providing, when provision of a second effect different from the first effect is specified while the first effect is being provided, the inputted musical sound data with the second effect in place of the first effect processing;

continuing variation in the parameter value while the second effect is being provided; and controlling such that, when the specification of the provision of the second effect is released, the first effect is provided based on the parameter value continued to be varied, wherein the first effect is not provided on the inputted musical sound data while the second effect is being provided on the inputted musical sound data.

12. The non-transitory computer-readable storage medium according to claim 11, comprising:

updating a tempo of a musical sound being played back to a specified tempo; and continuing to vary the parameter value based on the specified tempo.

* * * * *